United States Patent
Giovannini

(10) Patent No.: US 11,442,530 B2
(45) Date of Patent: Sep. 13, 2022

(54) MEMORY MANAGEMENT TO SAVE POWER

(71) Applicant: STMicroelectronics (Grenoble 2) SAS, Grenoble (FR)

(72) Inventor: Michael Giovannini, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 1 day.

(21) Appl. No.: 17/109,452

(22) Filed: Dec. 2, 2020

(65) Prior Publication Data

US 2021/0173468 A1     Jun. 10, 2021

(30) Foreign Application Priority Data

Dec. 4, 2019   (FR) ...................................... 1913749

(51) Int. Cl.
  *G06F 1/32* (2019.01)
  *G11C 5/14* (2006.01)
  *G06F 1/3234* (2019.01)
  *G06F 1/3225* (2019.01)
  *G06F 1/3287* (2019.01)

(52) U.S. Cl.
  CPC .......... *G06F 1/3275* (2013.01); *G06F 1/3225* (2013.01); *G06F 1/3287* (2013.01); *G11C 5/14* (2013.01)

(58) Field of Classification Search
  CPC .... G06F 1/2375; G06F 1/3225; G06F 1/3287; G11C 5/14
  See application file for complete search history.

(56) References Cited

U.S. PATENT DOCUMENTS

| | | | |
|---|---|---|---|
| 2005/0068826 A1* | 3/2005 | Hoehler | G11C 11/406 365/203 |
| 2007/0242556 A1* | 10/2007 | Harada | G11C 7/22 365/210.13 |
| 2007/0253268 A1* | 11/2007 | Kim | G11C 11/40607 365/222 |
| 2015/0268711 A1 | 9/2015 | Ramani et al. | |
| 2018/0067539 A1 | 3/2018 | Samson et al. | |

OTHER PUBLICATIONS

INPI Search Report and Written Opinion for FR 1913749 dated Jul. 22, 2020 (9 pages).

* cited by examiner

*Primary Examiner* — Stefan Stoynov
(74) *Attorney, Agent, or Firm* — Crowe & Dunlevy

(57) ABSTRACT

A memory includes writable memory units. Each memory unit is configurable: in a retention state wherein the memory unit is capable of retaining data until a subsequent power-off of the memory unit, and in a non-retention state wherein the memory unit does not retain data and consumes less power than in the first state. A controller configures any memory unit of the memory having undergone at least one write access since its last power-up to be in the retention state. The controller further configures at least one memory unit of the memory that has not undergone any write access since its last power-up in the non-retention state.

43 Claims, 4 Drawing Sheets

MEMORY MANAGEMENT TO SAVE POWER

PRIORITY CLAIM

This application claims the priority benefit of French Application for Patent No. 1913749, filed on Dec. 4, 2019, the content of which is hereby incorporated by reference in its entirety to the maximum extent allowable by law.

TECHNICAL FIELD

This document relates to the field of memory management for power saving purposes.

BACKGROUND

A system is configurable in a first operating mode and in a second operating mode consuming less power, these modes being selectable by means of user commands.

In the first mode of operation, the memory retains all the data that it stores until a subsequent power-off.

In the second mode of operation, the memory does not retain any data, hence the power saving achieved.

There is a need to control a memory so as to further reduce its power consumption, without losing any data that it would store.

SUMMARY

In accordance with a first aspect, a system comprises a memory comprising a plurality of writable memory units, each memory unit being configurable: in a retention state wherein the memory unit is capable of retaining data until a subsequent power-off of the memory unit, and in a non-retention state wherein the memory unit does not retain data and consumes less power than in the first state. The system further comprises a controller configured to configure in the retention state any memory unit of the memory having undergone at least one write access since its last power-up, and to configure in the non-retention state at least one memory unit of the memory that has not undergone any write access since its last power-up.

The system according to this first aspect may comprise the following optional features, taken alone or in combination when technically possible.

Preferably, the controller is configured to configure in the non-retention state any memory unit of the memory that has not undergone any write access since its last power-up.

Preferably, the memory is configurable in a plurality of modes. The plurality of modes includes: a first mode, wherein any memory unit of the memory having undergone at least one write access since its last power-up is in the retention state, and at least one memory unit of the memory that has not undergone any write access since its last power-up is in the non-retention state, and at least one other mode wherein all the memory units of the memory are in the same state.

Preferably, the plurality of modes further includes a second mode wherein all the memory units are in the retention state. The plurality of mode still further includes a third mode wherein all the memory units are in the non-retention state.

Preferably, the first mode is a mode wherein at least one system clock is deactivated.

Preferably, the system comprises an interface for receiving user commands requesting a configuration of the memory in one of the modes of the plurality of modes.

Preferably, the controller is configured to not authorize individual configuration of the state of a memory unit of the memory by means of a user command received by the interface.

Preferably, the memory is a volatile memory, for example a RAM memory.

Preferably, the system is of the system on chip (SoC) type.

According to a second aspect, a method is presented for controlling a memory comprising a plurality of writable memory units, each memory unit being configurable: in a retention state wherein the memory unit is capable of retaining data until a subsequent power-off of the memory unit, and in a non-retention state wherein the memory unit does not retain data and consumes less power than in the retention state. The method comprises the following steps: configuring any memory unit of the memory having undergone at least one write access since its last power-up to be in the retention state; and configuring at least one memory unit of the memory that has not undergone any write access since its last power-up to be in the non-retention state.

BRIEF DESCRIPTION OF THE DRAWINGS

Other features, purposes and advantages of the invention will emerge from the description which follows, which is purely illustrative and non-limiting, and which should be read with reference to the appended drawings, wherein.

In all the figures, similar elements carry identical references.

DETAILED DESCRIPTION

Figure 1:
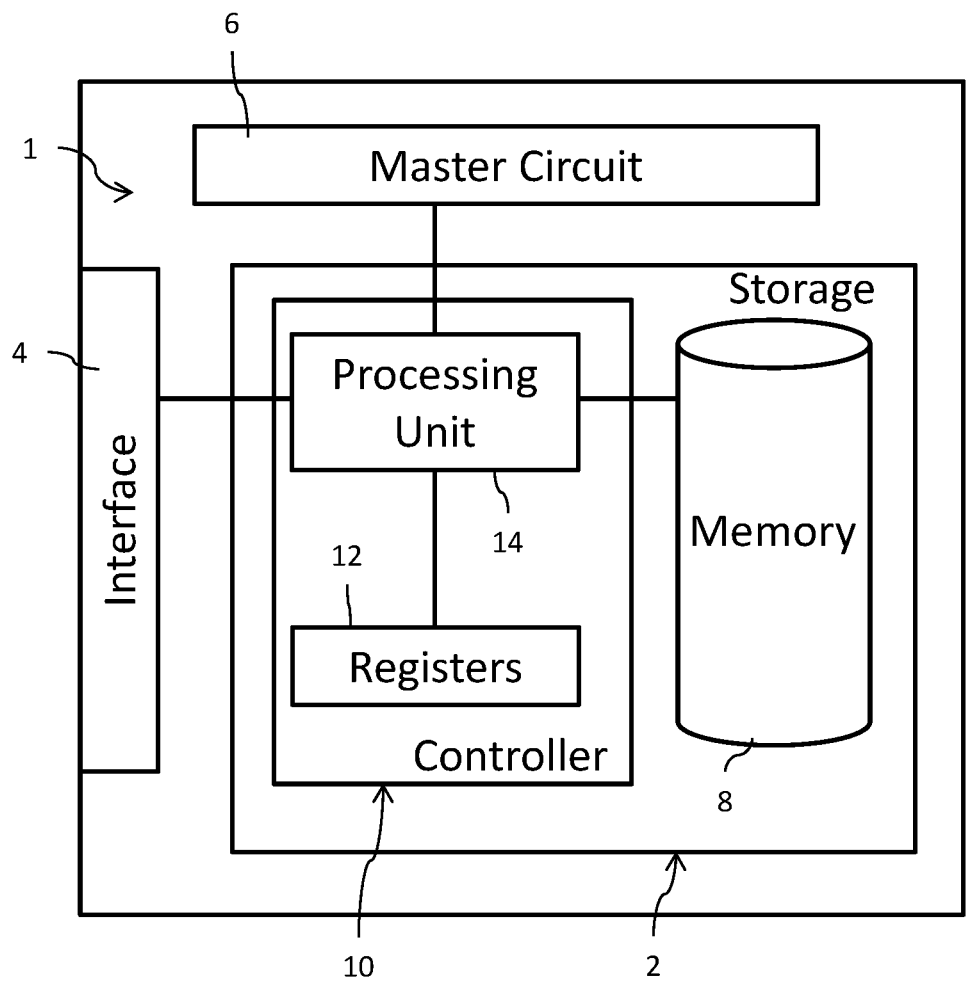
FIG. 1 schematically illustrates a system according to an embodiment.

With reference to FIG. 1, a system 1, such as a system on chip (SoC), comprises at least one storage device 2, a command reception interface 4 and at least one master circuit module 6.

The master circuit module 6 is typically a processor configured to execute program code.

The storage device 2 comprises a memory 8 and a controller 10 for controlling the memory 8.

The memory 8 is writable (or even readable) by the master circuit module 6.

The memory 8 is volatile, in the sense that any data that it stores is lost during a power-off of the memory 8. The memory 8 is, for example, of the RAM type.

Figure 2:
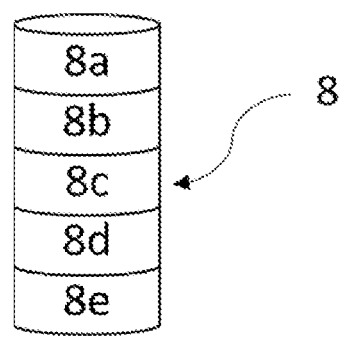
FIG. 2 schematically illustrates the internal organization of a memory of the system of FIG. 1.

With reference to FIG. 2, the memory 8 comprises a plurality of memory units 8a, 8b, 8c, 8d, 8e. Each memory unit 8a-8e is configurable to be in a retention state, and to be in a non-retention state.

In the retention state, a memory unit 8a-8e is capable of retaining data until a subsequent power-off of the memory unit.

In the non-retention state, a memory unit 8a-8e does not retain data, and consumes less power than in its retention state.

The different memory units 8a-8e are configurable in one or the other of these states independently of each other. In other words, different memory units 8a-8e from the memory 8 can be configured in different states.

The size of one of the memory units 8a-8e has a size comprised between 1 and 128 kilobytes, for example 64 kilobytes.

The number of memory units of the memory 8 is, for example, comprised between 1 and 20 (this number being five in the exemplary embodiment illustrated in FIG. 2). The memory 8 has an overall size equal to the sum of the respective sizes of its memory units. For example, this overall size is 320 kilobytes.

The memory 8 is configurable in several operating modes: a first mode known as RUN mode, a second mode known as STOP mode and a third mode known as STANDBY mode.

The RUN mode is the one which consumes the most power among the three abovementioned operating modes. When the memory 8 is in the RUN mode, all memory units 8a-8e of the memory 8 are in the retention state. This RUN mode is typically used during the execution of a program by the master circuit module 6. In the RUN mode, all the clocks of the system are activated.

The STANDBY mode is a low power consumption mode compared to the RUN mode. In the STANDBY mode, all the memory units 8a-8e of the memory 8 are in the non-retention state. In this mode, the memory 8 is simply not supplied with power. Thus, in this mode, no data can be retained by the memory 8, regardless of the memory unit where such data is written. In the STANDBY mode, all the clocks in the system are deactivated.

The STOP mode is in turn an intermediate mode which consumes less power than the RUN mode, but which potentially consumes more power than the STANDBY mode. In the STOP mode, the memory units of the memory 8 are capable of being in different states from each other. Thus, in this STOP mode, data can be retained by the memory 8, but this retention capacity depends on the considered memory unit 8a-8e. In the STOP mode, at least one clock of the system is deactivated.

The function of the controller 10 is to configure the memory 8 in one or the other of the three operating modes RUN, STOP and STANDBY.

It should be noted that these operating modes RUN, STOP and STANDBY are operating modes of the memory 8 which are selectable by a user, by means of commands transmitted to the system 1 via the command reception interface 4.

The controller 10 is, for example, a circuit, which is programmable (FPGA) or not (ASIC).

The function of the controller 10 is to configure the respective states of the memory units 8a-8e of the memory 8, according to a user command to configure the memory 8 in one of the overall operating modes RUN, STOP and STANDBY of this memory 8.

Unlike the RUN, STOP and STANDBY operating modes of the memory 8, the individual states of memory units 8a-8e of the memory 8 are not individually adjustable by user commands. It is the function of the controller 10 to adjust these states according to the commands received and this is done automatically, following a logic which is explained below.

The controller 10 comprises a plurality of registers 12, including a mode register and write registers.

The mode register is configured to store a current operating mode of the memory 8 (that is to say the last operating mode requested from outside the system 1 via a command received by the interface 4).

The write registers are, moreover, associated respectively with the memory units 8a-8e. In other words, each memory unit 8a-8e is associated with a write register which is specific thereto (which supposes, in the exemplary embodiment illustrated in FIG. 2, the existence of five write registers). As will be seen in more detail below, a write register associated with a memory unit 8a-8e indicates whether or not at least one write of data has occurred in this memory unit, since the last power-up of the system 1.

For example, a write register can store:
 A first value, such as zero, to indicate that no write has occurred in the associated one of the memory units 8a-8e since the last power-up of the system 1 in the associated memory unit.
 A second value, such as one, to indicate that at least one write has occurred in the associated one of the memory units 8a-8e since the last power-up of the system 1 in the associated memory unit.
 A write register can thus be coded on a single bit.

Moreover, the controller comprises a processing unit 14, configured to process requests for access to the memory 8 emanating from the master circuit module 6, and to process commands for reconfiguring the memory in a new operating state, emanating from the interface 4.

The processing unit 14 is capable of relaying the access requests to the memory units emitted by the master circuit module of the system 1.

The system 1 may comprise a plurality of storage devices 2 in accordance with the above description. Each of these devices 2 comprises a memory 8 and a controller 10 for controlling specifically this memory 8. Otherwise, there are as many controllers 10 as memories 8 in the system 1.

When the system 1 comprises several memories, these memories can be of variable sizes and/or be used for different purposes.

For example, the system 1 can comprise: a first memory dedicated to the storage of execution data, in particular an execution stack, a second memory dedicated to the storage of security data, such as error correcting codes, and a third memory constituting an extension of the first memory.

The system 1 described above, and particularly the controller 10, operates in the following manner.

Initialization of the Controller:

When system 1 is powered up, the write registers of the controller 10 are all set to zero.

Moreover, the mode register is set at a default mode among the different modes available, for example the STOP mode.

Figure 3:
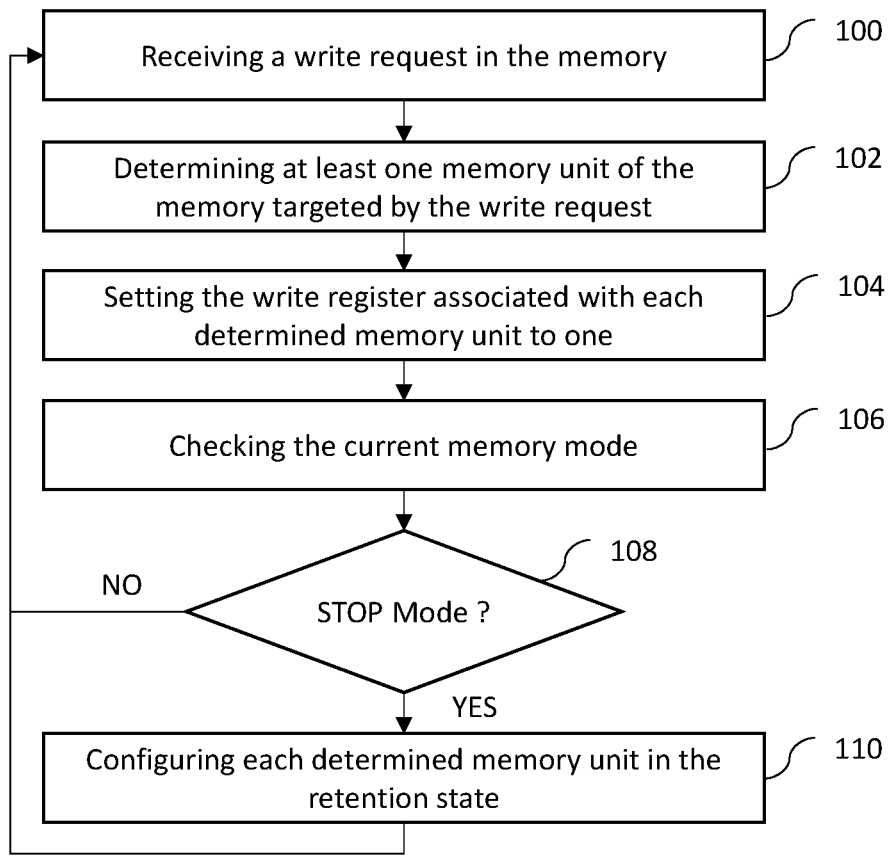
FIG. 3 is a flow diagram of steps of a method according to an embodiment, implemented during a write request.

Write Access:

When the master circuit module 6 emits a request to write data to the memory 8, the following steps are implemented with reference to FIG. 3.

The write request is received by the controller 10 (step 100). The write request typically comprises a write address in the memory 8 and the data to be written in the memory 8, these data occupying a size indicated in the write request or deducible therefrom.

The controller 10 determines, on the basis of the write request, the memory unit(s) 8a-8b of the memory 8 targeted by the request, that is to say those whose content is updated by writing (step 102). This determination 102 can be implemented before, during or after writing in the memory 8.

The write register associated with each memory unit targeted by the write request is set to one by the controller 10 (step 104). This setting to one is implemented, for example, once the writing is effective.

On the other hand, the write registers of the memory units of the memory 8 which are not affected by the write request are not modified in step 104.

Moreover, the controller 10 checks what is the current operating mode of the memory 8, by reading the content of the mode register (step 106).

In the particular case where this operating mode is the STOP mode (step 108), the controller 10 switches each memory unit determined during step 102 to the retention state (step 110).

On the other hand, the controller 10 does not change the respective states of the memory units 8a-8e not affected by the write request. Furthermore, if the current operating mode is not the STOP mode, the control does not implement step 110.

Figure 4:
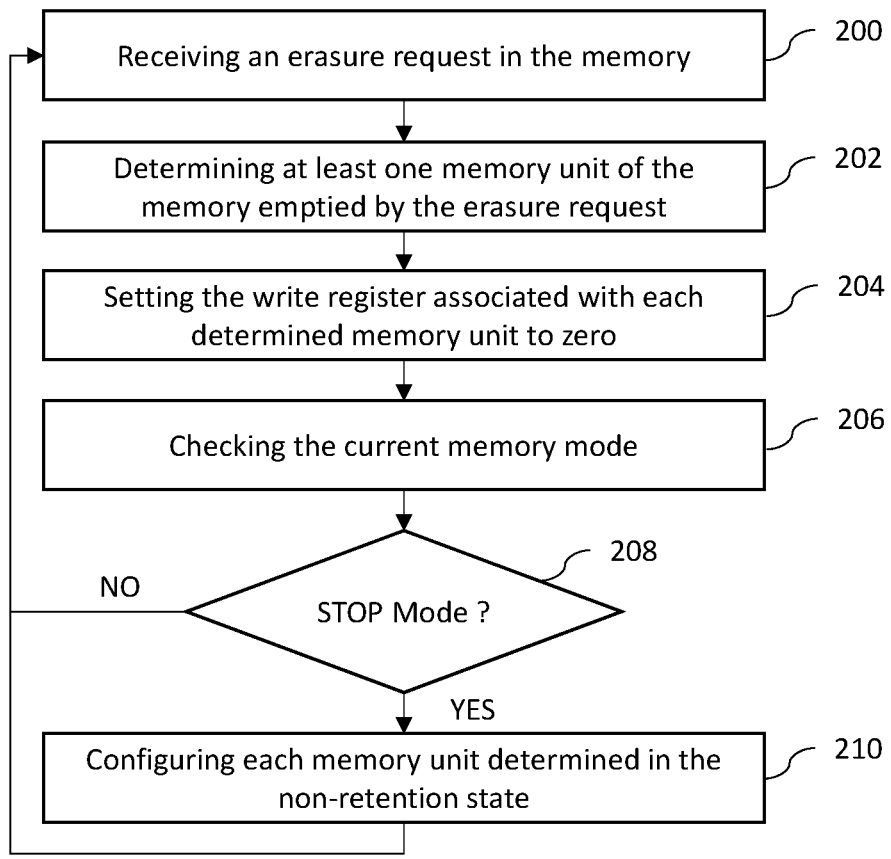
FIG. 4 is a flow diagram of steps of a method according to an embodiment, implemented during a request for erasure.

Emptying a Memory Unit:

When the master circuit module 6 emits a request to erase data stored in the memory 8, the following steps are implemented with reference to FIG. 4.

Such an erasure request can be emitted for security reasons, for example when unauthorized access to the system or even to the memory 8 is detected.

The erasure request is received by the controller 10 (step 200). The erasure request typically comprises an erasure address and the size of the data to be erased.

The controller 10 determines, on the basis of the erasure request, at least one memory unit of the memory 8 targeted by the request to be completely emptied at the end of the requested erasure (step 202). In this context, the phrase "completely emptied" means that the memory unit no longer contains any readable data after the erasure.

This determination 202 can be implemented before, during or after the erasure in the memory 8.

The write register associated with each memory unit 8a-8e determined during step 202 is set to zero by the controller 10 (step 204). This zero setting is implemented, for example, once the erasure is effective.

On the other hand, the write registers of the memory units of the memory 8 which are not completely emptied by the erasure are not modified during step 204.

Moreover, the controller 10 checks what is the current operating mode of the memory 8 (step 206). In the particular case where this operating mode is the STOP mode (step 208), the controller 10 switches each memory unit determined during step 202 to the non-retention state (step 210).

The controller 10 does not change the respective states of the memory units which are not completely emptied by the erase request. Furthermore, if the current operating mode is not the STOP mode, the controller does not implement the step 210.

Figure 5:
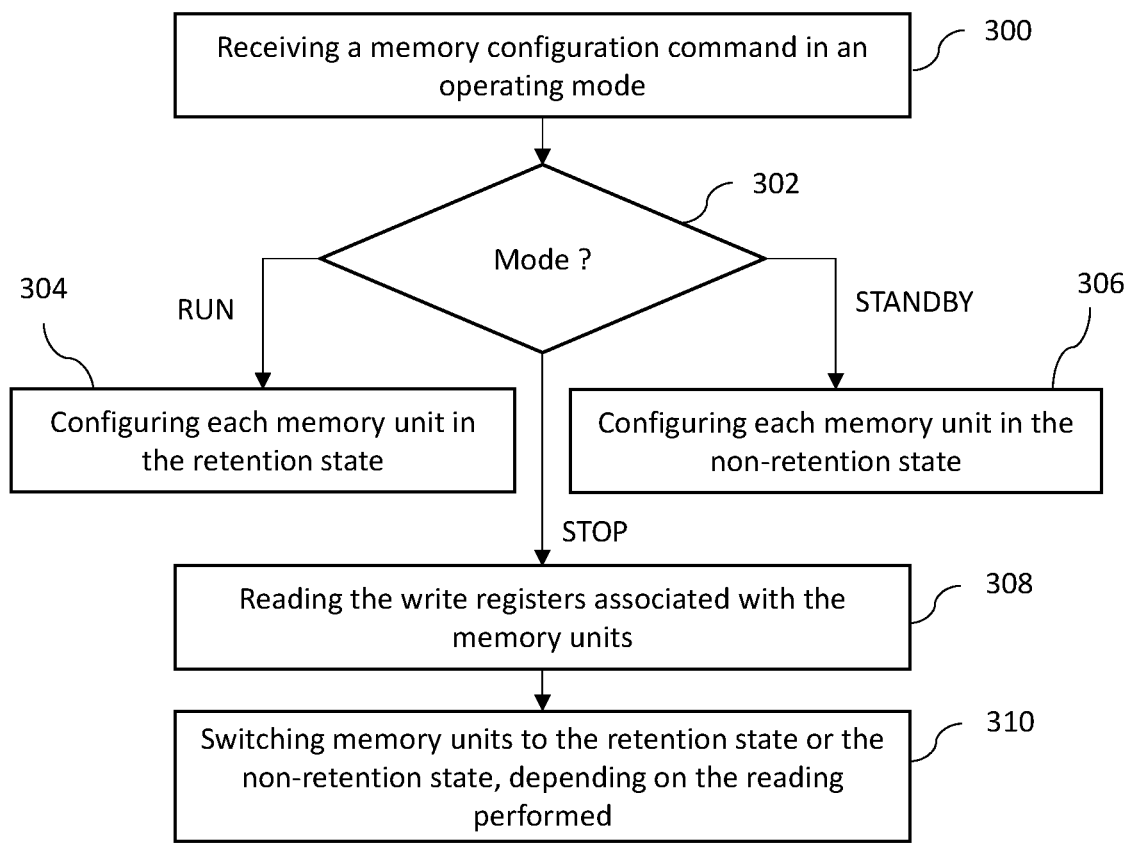
FIG. 5 is a flow diagram of steps of a method according to an embodiment, for changing a memory of operating mode.

Memory Configuration in a New Operating Mode:

When the interface 4 receives a command to configure the memory 8 in one of the abovementioned operating modes (RUN, STOP or STANDBY), the steps are then implemented with reference to FIG. 5.

The command received by the interface 4 is transmitted to the controller 10.

The controller 10 compares the operating mode targeted by the received command and the current operating mode indicated in its internal mode register (step 302).

If the two compared modes are identical, the controller 10 does not process the received command.

If the two compared modes are different, the controller 10 determines, on the basis of the received command, a destination state to which each memory unit of the memory 8 is to be switched.

If the command received requests a configuration of the memory 8 in the RUN mode, the controller 10 switches all the memory units to the retention mode, unless these memory units are already there (step 304).

If the command received requests a configuration of the memory 8 in the STANDBY mode, the controller 10 switches all the memory units to the non-retention mode, unless these memory units are already there (step 306).

If the command received requests a configuration of the memory 8 in the STOP mode, then the controller 10 adopts a finer, and potentially heterogeneous, configuration policy for the memory units 8a-8e. Indeed, the controller 10 configures any memory unit of the memory 8 having undergone at least one write access since its last power-up in the retention state (step 310). The controller 10 moreover configures at least one memory unit of the memory 8 which has not undergone any write access since its last power-up, or even any memory unit which has not undergone such write access, during step 310 in the non-retention state.

To apply this policy, the controller 10 reads (step 308) the write registers respectively associated with the memory units 8a-8e. If a write register is zero, this means that no write has occurred in the associated memory unit since the last power-up; this memory unit will therefore switch to the non-retention state, unless it is already there. If, on the contrary, a write register is one, this means that at least one write has occurred in the associated memory unit since the last power-up; this memory unit will therefore switch to the retention state, unless it is already there.

The policy implemented by the controller 10 allows optimally reducing the power consumption of the memory 8 when the latter is in the STOP operating mode, without loss of stored data.

Moreover, it will be noted that the system 1 operates at two configuration levels:
- a high level and public configuration level (the overall operating modes of the memory 8) that a user of the system 1 can select, and
- a lower level and private configuration level (the respective states of the memory units), which are under the control of the controller 10, but on which a user cannot exercise individual control.

This dual level of configuration allows obtaining an ideal compromise between the versatility of the system 1 and optimal management of power savings.

Other Variants:

In the foregoing, an embodiment of the RUN operating mode has been presented wherein all the memory units 8a-8e of the memory 8 are in the retention state.

Alternatively, the policy for switching states of the memory units implemented when the memory 8 is in the STOP operating mode is also implemented when the memory 8 is in the RUN operating mode.

The invention claimed is:

1. A system, comprising:
   a memory including a plurality of writable memory units, wherein the memory is configurable in a plurality of modes and wherein each writable memory unit is configurable to operate:
   in a retention state where the writable memory unit will retain data until a subsequent power-off of the memory unit; and
   in a non-retention state where the writable memory unit does not retain data and consumes less power than in the retention state;

an interface configured to receive user commands requesting a configuration of the memory in a selected mode of the plurality of modes; and a controller that is configured to:
configure any writable memory unit of the memory having undergone at least one write access since its last power-up to be in the retention state;
configure at least one writable memory unit of the memory that has not undergone any write access since its last power-up to be in the non-retention state; and
not authorize individual configuration of the state of a writable memory unit of the memory by means of one of the user commands received by the interface.

2. The system according to claim 1, wherein the controller is further configured to configure any writable memory unit of the memory that has not undergone any write access since its last power-up to be in the non-retention state.

3. The system according to claim 1, wherein the plurality of modes comprise:
a first mode wherein any writable memory unit of the memory having undergone at least one write access since its last power-up is in the retention state, and wherein at least one writable memory unit of the memory that has not undergone any write access since its last power-up is in the non-retention state; and
at least one other mode wherein all the writable memory units of the memory are in a same state.

4. The system according to claim 3, wherein the first mode is a mode wherein at least one system clock is deactivated.

5. The system according to claim 3, wherein the at least one other mode comprises:
a second mode wherein all the writable memory units are in the retention state; and
a third mode wherein all the writable memory units are in the non-retention state.

6. The system according to claim 5, wherein the first mode is a mode wherein at least one system clock is deactivated.

7. The system according to claim 1, further comprising a write register for each writable memory unit, wherein the register stores data indicating whether the memory unit has undergone at least one write access since its last power-up.

8. The system according to claim 7, wherein the controller, in response to a received write request in the memory, is configured to:
identify ones of the writable memory units targeted by said received write request; and
set the data in the corresponding write registers to indicate that the memory unit has undergone at least one write access since its last power-up.

9. The system according to claim 1, wherein the memory is a volatile memory.

10. The system according to claim 1, wherein the system is of a system on chip type.

11. A method for controlling a memory that comprises a plurality of writable memory units, each memory unit being configurable: in a retention state wherein the memory unit retains data until a subsequent power-off of the memory unit, and in a non-retention state wherein the memory unit does not retain data and consumes less power than in the retention state;
wherein the method comprises the following steps:
configuring any memory unit of the memory having undergone at least one write access since its last power-up to be in the retention state; and
configuring at least one memory unit of the memory that has not undergone any write access since its last power-up to be in the non-retention state; and
refusing to authorize individual configuration of the state of a writable memory unit of the memory by means of a user command requesting a configuration of the memory in a selected mode of a plurality of modes.

12. The method according to claim 11, further comprising configuring any writable memory unit of the memory that has not undergone any write access since its last power-up to be in the non-retention state.

13. The method according to claim 11, further comprising:
receiving user commands; and
wherein the plurality of modes comprise:
a first mode wherein any writable memory unit of the memory having undergone at least one write access since its last power-up is in the retention state, and wherein at least one writable memory unit of the memory that has not undergone any write access since its last power-up is in the non-retention state; and
at least one other mode wherein all the writable memory units of the memory are in a same state.

14. The method according to claim 13, further comprising deactivating at least one system clock in the first mode.

15. The method according to claim 13, wherein the at least one other mode comprises:
a second mode wherein all the writable memory units are in the retention state; and
a third mode wherein all the writable memory units are in the non-retention state.

16. The method according to claim 11, further comprising storing data indicating whether the memory unit has undergone at least one write access since its last power-up in a write register for each writable memory unit.

17. The method according to claim 16, further comprising:
receiving a memory write request;
identifying ones of the writable memory units targeted by said memory write request; and
setting the data in the corresponding write registers to indicate that the memory unit has undergone at least one write access since its last power-up.

18. A system, comprising:
a memory including a plurality of writable memory units, wherein each writable memory unit is configurable to operate:
in a retention state where the writable memory unit will retain data until a subsequent power-off of the memory unit; and
in a non-retention state where the writable memory unit does not retain data and consumes less power than in the retention state; and
a controller including a write register for each writable memory unit, wherein the register stores data indicating whether the memory unit has undergone at least one write access since its last power-up;
wherein the controller is configured to:
configure any writable memory unit of the memory having undergone at least one write access since its last power-up to be in the retention state; and
configure at least one writable memory unit of the memory that has not undergone any write access since its last power-up to be in the non-retention state;

wherein the controller is further configured, in response to a received write request in the memory, to:
  identify ones of the writable memory units targeted by said received write request;
  write to the identified writable memory units;
  set the data in the corresponding write registers to indicate that the memory unit has undergone at least one write access since its last power-up; and
  determine a current operating mode of the memory and:
    configure each of the identified ones of the writable memory units in the retention state if the current operating mode is a STOP mode where writable memory units can be in different states; and
    if the current operating mode is not the STOP mode, then do not configure each of the identified ones of the writable memory units in the retention state.

19. The system according to claim 18, wherein the controller is further configured to configure any writable memory unit of the memory that has not undergone any write access since its last power-up to be in the non-retention state.

20. The system according to claim 18, wherein in the STOP mode any writable memory unit of the memory having undergone at least one write access since its last power-up is in the retention state, and wherein the at least one writable memory unit of the memory that has not undergone any write access since its last power-up is in the non-retention state.

21. The system according to claim 20, wherein in the STOP mode at least one system clock is deactivated.

22. The system according to claim 18, wherein the memory is further configurable to operation in:
  a mode where all the writable memory units are in the retention state; and
  a mode where all the writable memory units are in the non-retention state.

23. The system according to claim 18, wherein the memory is a volatile memory.

24. The system according to claim 18, wherein the system is of a system on chip type.

25. A system, comprising:
  a memory including a plurality of writable memory units, wherein each writable memory unit is configurable to operate:
    in a retention state where the writable memory unit will retain data until a subsequent power-off of the memory unit; and
    in a non-retention state where the writable memory unit does not retain data and consumes less power than in the retention state; and
  a controller including a write register for each writable memory unit, wherein the register stores data indicating whether the memory unit has undergone at least one write access since its last power-up;
  wherein the controller is configured to:
    configure any writable memory unit of the memory having undergone at least one write access since its last power-up to be in the retention state; and
    configure at least one writable memory unit of the memory that has not undergone any write access since its last power-up to be in the non-retention state;
  wherein the controller is further configured, in response to a received erase request in the memory to:
    identify ones of the writable memory units to be emptied by said received erase request; and
    set the data in the corresponding write registers to indicate that the memory unit has not undergone at least one write access since its last power-up.

26. The system according to claim 25, wherein the controller is further configured to determine a current operating mode of the memory and:
  configure each of the identified ones of the writable memory units in the non-retention state if the current operating mode is a STOP mode where writable memory units can be in different states; and
  if the current operating mode is not the STOP mode, then do not configure each of the identified ones of the writable memory units in the retention state.

27. The system according to claim 25, wherein the controller is further configured to configure any writable memory unit of the memory that has not undergone any write access since its last power-up to be in the non-retention state.

28. The system according to claim 25, wherein in the STOP mode any writable memory unit of the memory having undergone at least one write access since its last power-up is in the retention state, and wherein the at least one writable memory unit of the memory that has not undergone any write access since its last power-up is in the non-retention state.

29. The system according to claim 28, wherein in the STOP mode at least one system clock is deactivated.

30. The system according to claim 25, wherein the memory is further configurable to operation in:
  a mode where all the writable memory units are in the retention state; and
  a mode where all the writable memory units are in the non-retention state.

31. The system according to claim 25, wherein the memory is a volatile memory.

32. The system according to claim 25, wherein the system is of a system on chip type.

33. A method for controlling a memory that comprises a plurality of writable memory units, each memory unit being configurable: in a retention state wherein the memory unit retains data until a subsequent power-off of the memory unit, and in a non-retention state wherein the memory unit does not retain data and consumes less power than in the retention state;
  wherein the method comprises the following steps:
    configuring any memory unit of the memory having undergone at least one write access since its last power-up to be in the retention state;
    configuring at least one memory unit of the memory that has not undergone any write access since its last power-up to be in the non-retention state;
    storing data indicating whether the memory unit has undergone at least one write access since its last power-up in a write register for each writable memory unit;
    receiving a memory write request;
    identifying ones of the writable memory units targeted by said memory write request;
    writing to the identified writable memory units;
    setting the data in the corresponding write registers to indicate that the memory unit has undergone at least one write access since its last power-up;
    determining a current operating mode of the memory;
    configuring each of the identified ones of the writable memory units in the retention state if the current operating mode is a STOP mode where writable memory units can be in different states; and if the current operating mode is not the STOP mode, then not configuring each of the identified ones of the writable memory units in the retention state.

34. The method according to claim 33, further comprising configuring any writable memory unit of the memory that has not undergone any write access since its last power-up to be in the non-retention state.

35. The method according to claim 33, further comprising:
receiving user commands requesting a configuration of the memory in a selected mode of a plurality of modes; and
wherein the plurality of modes comprise:
a first mode wherein any writable memory unit of the memory having undergone at least one write access since its last power-up is in the retention state, and wherein at least one writable memory unit of the memory that has not undergone any write access since its last power-up is in the non-retention state; and
at least one other mode wherein all the writable memory units of the memory are in a same state.

36. The method according to claim 35, further comprising deactivating at least one system clock in the first mode.

37. The method according to claim 35, wherein the at least one other mode comprises:
a second mode wherein all the writable memory units are in the retention state; and
a third mode wherein all the writable memory units are in the non-retention state.

38. A method for controlling a memory that comprises a plurality of writable memory units, each memory unit being configurable: in a retention state wherein the memory unit retains data until a subsequent power-off of the memory unit, and in a non-retention state wherein the memory unit does not retain data and consumes less power than in the retention state;
wherein the method comprises the following steps:
configuring any memory unit of the memory having undergone at least one write access since its last power-up to be in the retention state;
configuring at least one memory unit of the memory that has not undergone any write access since its last power-up to be in the non-retention state;
storing data indicating whether the memory unit has undergone at least one write access since its last power-up in a write register for each writable memory unit;
receiving a memory erase request;
identifying ones of the writable memory units to be emptied by said memory erase request; and
setting the data in the corresponding write registers to indicate that the memory unit has not undergone at least one write access since its last power-up.

39. The method according to claim 38, further comprising:
determining a current operating mode of the memory;
configuring each of the identified ones of the writable memory units in the non-retention state if the current operating mode is a STOP mode; and
if the current operating mode is not the STOP mode, then not configuring each of the identified ones of the writable memory units in the retention state.

40. The method according to claim 38, further comprising configuring any writable memory unit of the memory that has not undergone any write access since its last power-up to be in the non-retention state.

41. The method according to claim 38, further comprising:
receiving user commands requesting a configuration of the memory in a selected mode of a plurality of modes; and
wherein the plurality of modes comprise:
a first mode wherein any writable memory unit of the memory having undergone at least one write access since its last power-up is in the retention state, and wherein at least one writable memory unit of the memory that has not undergone any write access since its last power-up is in the non-retention state; and
at least one other mode wherein all the writable memory units of the memory are in a same state.

42. The method according to claim 41, further comprising deactivating at least one system clock in the first mode.

43. The method according to claim 41, wherein the at least one other mode comprises:
a second mode wherein all the writable memory units are in the retention state; and
a third mode wherein all the writable memory units are in the non-retention state.

* * * * *